United States Patent [19]

Takeuchi et al.

[11] Patent Number: 5,404,220
[45] Date of Patent: Apr. 4, 1995

[54] MEASURING METHOD AND MEASURING APPARATUS FOR DETERMINING THE RELATIVE DISPLACEMENT OF A DIFFRACTION GRATING WITH RESPECT TO A PLURALITY OF BEAMS

[75] Inventors: Seiji Takeuchi; Tetsuharu Nishimura, both of Kawasaki; Minoru Yoshii, Tokyo; Hiroyasu Nose, Zama; Koh Ishizuka, Urawa, all of Japan

[73] Assignee: Canon Kabushiki Kaisha, Tokyo, Japan

[21] Appl. No.: 955,979

[22] Filed: Oct. 2, 1992

[30] Foreign Application Priority Data

Oct. 3, 1991 [JP] Japan .................. 3-283583
Jan. 31, 1992 [JP] Japan .................. 4-016519
Apr. 21, 1992 [JP] Japan .................. 4-101319

[51] Int. Cl.⁶ .................................. G01B 9/02
[52] U.S. Cl. .............................. 356/349; 356/356
[58] Field of Search ............. 356/356, 349, 351, 363; 250/237 G, 231.16

[56] References Cited

U.S. PATENT DOCUMENTS

| | | | |
|---|---|---|---|
| 34,010 | 10/1893 | Magome et al. | 356/356 |
| 4,948,251 | 8/1990 | Kondo | 356/349 |
| 5,000,573 | 3/1991 | Suzuki et al. | 356/349 |
| 5,070,250 | 12/1991 | Komatsu et al. | 356/356 |
| 5,104,225 | 4/1992 | Masreliez | 356/356 |
| 5,126,562 | 6/1992 | Ishizuka | 250/231.14 |
| 5,182,610 | 1/1993 | Shibata | 356/356 |
| 5,214,489 | 5/1993 | Mizutani et al. | 356/363 |
| 5,231,467 | 7/1993 | Takeuchi et al. | 356/356 |
| 5,249,032 | 9/1993 | Matsui et al. | 356/356 |

FOREIGN PATENT DOCUMENTS 58-191907  11/1983  Japan .

OTHER PUBLICATIONS

IBM Technical Disclosure Bulletin, "Interferometric Method of Checking The Overlay Accuracy in Photolithographic Exposure Processes", vol. 32, No. 10B, Mar. 1990, pp. 214–217.
Patent Abstracts of Japan, vol. 15, No. 79, Feb. 25, 1991, English Abstract of Japanese Pat. No. 2-297005.

*Primary Examiner*—Samuel A. Turner
*Assistant Examiner*—Russell C. Wolfe
*Attorney, Agent, or Firm*—Fitzpatrick, Cella, Harper & Scinto

[57] ABSTRACT

A method and an apparatus for measuring a very small displacement of an object. The first and second beat signals are produced by light beams of different frequencies diffracted by a diffraction grating. The phase difference between the first and second beat signals is detected, thereby measuring the relative displacement of the diffraction grating.

14 Claims, 11 Drawing Sheets

MEASURING METHOD AND MEASURING APPARATUS FOR DETERMINING THE RELATIVE DISPLACEMENT OF A DIFFRACTION GRATING WITH RESPECT TO A PLURALITY OF BEAMS

BACKGROUND OF THE INVENTION

1. Field of the Invention

The present invention relates to a measuring method and apparatus, and more particularly, the present invention is suitable for use in optical heterodyne interference arrangements, for example, apparatus which measure a very small displacement of an object by using a diffraction means, such as a diffraction grating.

2. Related Background Art

Hitherto, a so-called optical encoder which measures a movement amount or a rotation amount of an object by using an optical scale has been used in the field of mechanical control. A conventional optical encoder has been disclosed in, for example, Japanese Patent Appln. Laid-Open No. 58-191907. In this optical encoder, coherent light from a light source is made to enter a diffraction grating which is a reference scale through a mirror or the like. ±N-th-order diffracted light emitted from this diffraction grating is reflected by a corner cube to its original direction and is also made to enter the diffraction grating. Then, two diffracted light beams of ±N-th order are diffracted in the same direction to interfere with each other. The intensity of the resulting interference light is detected by an optical sensor.

Since such an apparatus is small and can achieve a high resolution, it has been used for various purposes and for a variety of applications.

As machining and control have become more precise and fine, it has been required that such a measuring apparatus have a higher resolution than ever before.

SUMMARY OF THE INVENTION

An object of the present invention is to provide a measuring apparatus which achieves a higher resolution than before in the field of optical encoders in the optical displacement information detection.

DESCRIPTION OF THE PREFERRED EMBODIMENTS

A measuring apparatus of the embodiments which will now be described includes a light-beam forming unit for forming a first pair of beams having different frequencies and a second pair of beams having different frequencies which are combined in such a manner as to generate beat signals having the same frequency; an irradiation unit for irradiating each of the pairs of beams in such a way that a light beam of one of the pair of beams having a low frequency and a light beam of the other pair of beams having a high frequency are diffracted at a first order by means of diffraction unit and that a light beam of one of the pair of beams having a high frequency and a light beam of the other pair of beams having a low frequency are diffracted at a second order whose sign is different from that of the first order by means of the diffraction unit; and displacement information detection unit for obtaining relative displacement information of the diffraction unit by comparing a first beat signal obtained by causing the first pair of diffracted beams to interference with each other with a second beat signal obtained by causing the second pair of diffracted beams to interfere with each other.

Figure 1:
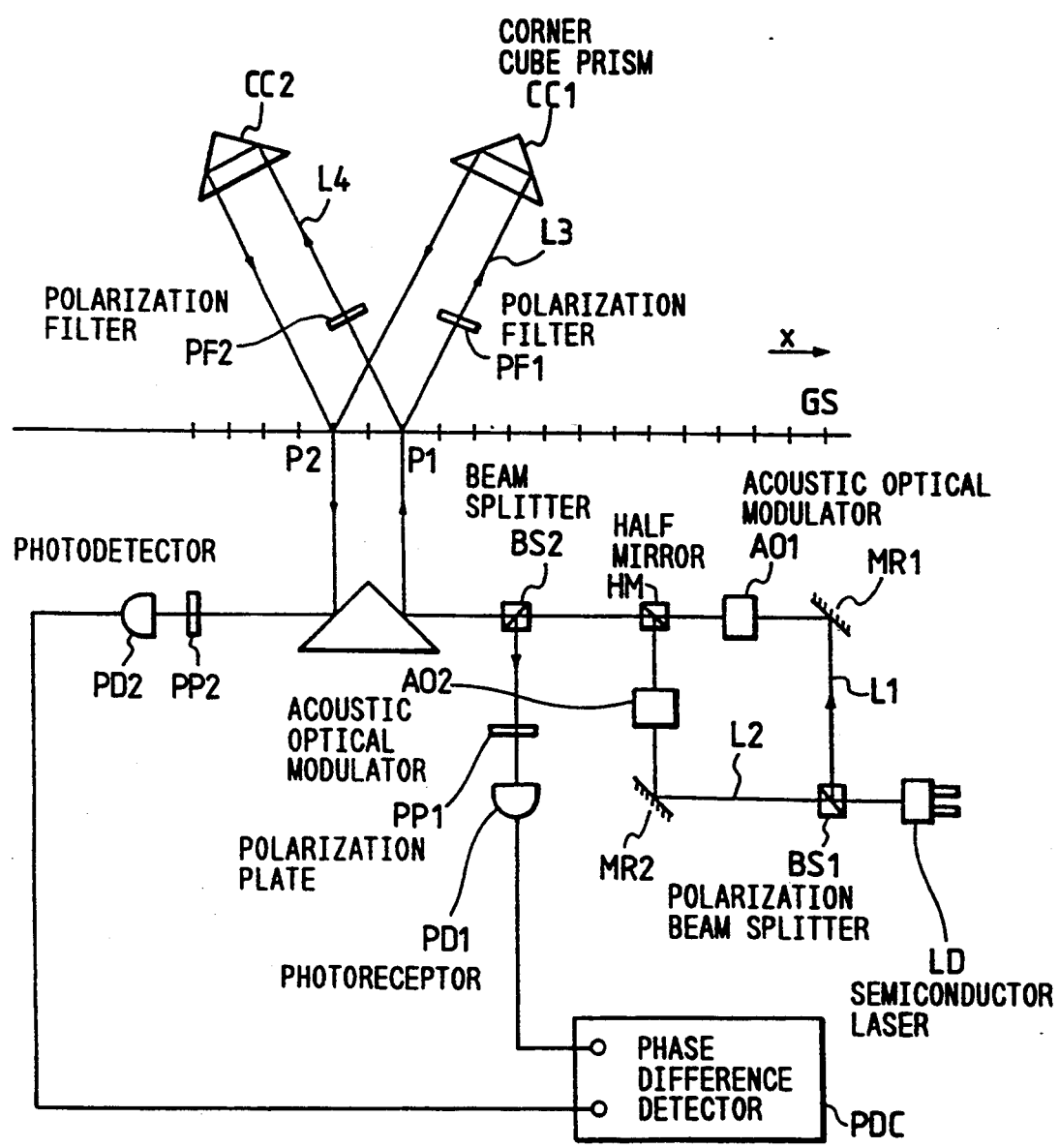
FIG. 1 is a schematic view of an apparatus using the technology which is a prerequisite for embodiments of the present invention.

Before the embodiments are explained, the technology which is a prerequisite for subsequent embodiments will be described below with reference to FIG. 1. FIG. 1 is a schematic view of a length measuring apparatus using the prerequisite technology.

In FIG. 1, first a monochromatic light beam from a semiconductor laser LD is divided into two light beams L1 and L2 by a polarization beam splitter BS1. The light beams L1 and L2 are made to enter acoustic optical modulators AO1 and AO2, respectively. Frequencies $f_1$ and $f_2$ of outgoing light beams whose polarization planes are tilted by 90° relative to each other are shifted so that the frequencies differ to an extent that the beat signals thereof can be electrically observed. The light beams are merged by a half mirror HM.

A part of this merged light beam is extracted by a beam splitter BS2, and an optical heterodyne signal is obtained as a reference signal by a photoreceptor element PD1. A polarization plate PP1 whose polarization orientation is tilted by 45° is inserted at a location before the PD1 to cause the polarization planes of the two light beams to be aligned and to cause the light beams to interfere with each other at that time.

When the remaining light beam divided by BS2 enters the diffraction grating GS perpendicularly and is diffracted, the phase $\delta$ of the diffraction grating GS is added to the diffraction wave front. If it is assumed that the initial phase of an incident beam is 0, the phase of the diffracted waves is expressed as $\exp\{i\,(wt+m\delta)\}$, where m is the order of diffraction. For example, the +first-order light beam and −first-order light beam are $\exp\{i\,(wt+\delta)\}$ and $\exp\{i\,(wt-\delta)\}$, respectively. To extract light beams only of frequency $f_1$ for +first-order light beam L3 and light beams only of frequency $f_2$ for −first-order light beam L4, polarization filters PF1 and PF2 are disposed inside the optical paths for the light beams L3 and L4, respectively. The light beams L3 and L4 enter corner cube prisms CC1 and CC2, are reflected in a direction parallel and opposite to the incidence direction, respectively, are made to return to a point P2 on the diffraction grating GS, are diffracted a second time at the same order as that of the first diffraction to become one light beam, interfere with each other and enter the photoreceptor element PD2.

There is a phase lead of one wavelength in the phase of the +first-order light beam L3 for a displacement corresponding to one pitch of the diffraction grating GS along the x orientation. There is a phase delay of one wavelength in the phase of the −first-order light beam L4. As these light beams are once more reflected by the corner cube prisms CC1 and CC2 and diffracted at the same order as before, a phase difference for four wavelengths is added to the phases of the two light-beams when the light beams are merged.

If a light beam having a frequency $f_1$ is represented by $u_1 = a \exp\{i(w_1 t)\}$, and a light beam having a frequency $f_2$ is represented by $u_2 = b \exp\{i(w_2 t)\}$ (where a, b are constants, t is time, and i is an imaginary unit), an optical heterodyne signal obtained by the photoreceptor element PD1 as a reference signal is expressed as follows:

$$I_{REF} = a^2 + b^2 + 2ab \cos(w_1 - w_2)t$$

Since, in the above equation, $w_1 = 2\pi f_1$ and $w_2 = 2\pi f_2$, this signal is a signal with a frequency corresponding to the difference between $f_1$ and $f_2$. Since the phase δ of the diffraction grating GS is added to the +first-order light beam L3 each time the light beam L3 is diffracted and finally the +first-order light beam is diffracted two times, the following expression can be obtained:

$$u'_1 = a' \exp\{i(w_1 t + 2\delta)\}$$

where a' is a constant.

Since the phase δ of the diffraction grating GS is subtracted from the −first-order light beam L4 each time the light beam L4 is diffracted and finally the −first-order light beam is diffracted two times, a light beam expressed as $$u'_2 = b' \exp\{i(w_2 t - 2\delta)\}$$

(where b' is a constant) is incident on the photoreceptor element PD2. Therefore, an optical heterodyne signal obtained by the photoreceptor element PD2 is expressed as follows:

$$I_{SiG} = a'^2 + b'^2 + 2a'b' \cos\{(w_1 - w_2)t + 4\delta\}$$

The frequency of this signal is the same as that of the reference signal, but the phase of the optical heterodyne signal is out of phase with the reference signal by an amount 4δ proportional to the amount of movement of the diffraction grating GS, i.e. X ($= \delta/2\delta \cdot P$, wherein P is the grating constant).

Two optical heterodyne signals obtained by the photoreceptor elements PD1 and PD2 are input to a phase difference detector PDC. The phase difference between the signals (denoted as θ) is detected to measure the amount of movement of the diffraction grating GS. If the grating constant of the diffraction grating GS is set at 1.6 μm and the amount of movement of diffraction grating GS is denoted as x, the following relation is satisfied:

$$\theta = 4\delta = 4 \times \frac{2\pi x}{1.6} \text{ [rad]}$$

Therefore, when a phase deviation of one cycle, i.e., 2π [rad], is detected, it is clear that the diffraction grating GS is moved by 1.6 μm ÷ 4 = 0.4 μm. Detection of an amount of movement with a high degree of resolution is made possible by making the minimum detection phase difference sufficiently smaller than one cycle. If a phase difference detector which is capable of resolving up to, for example, 0.2°, is used, theoretically, a displacement up to 0.22 [nm] can be measured.

Embodiments will be explained below with reference to the accompanying drawings on the basis of the prerequisite technology described above.

Figure 2:
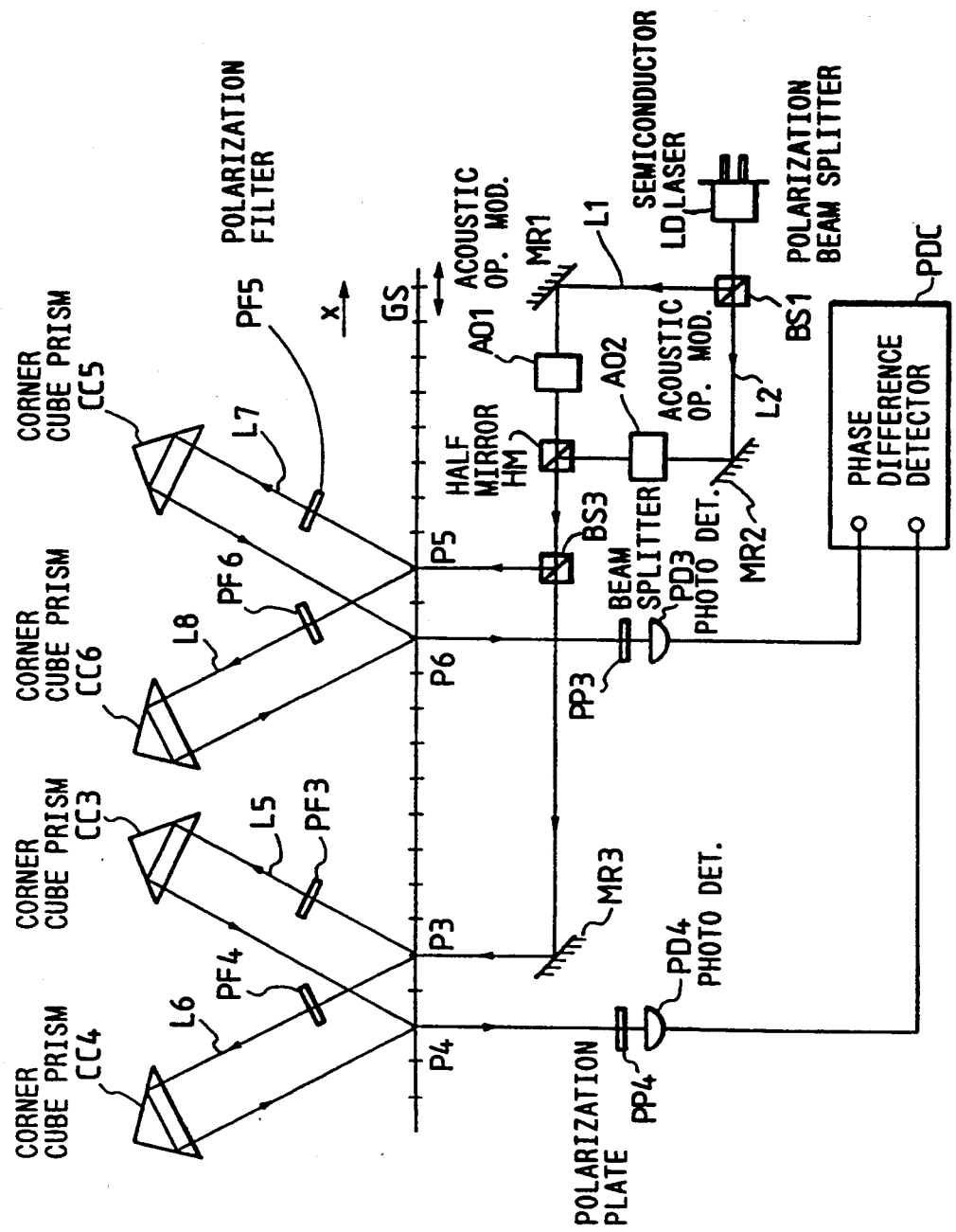
FIG. 2 is a schematic view of a length measuring apparatus of a first embodiment of the present invention.

FIG. 2 is a schematic view of a length measuring apparatus of the first embodiment of the present invention. Components in FIG. 2 which are the same as those shown in FIG. 1 are given the same reference numerals.

In FIG. 2, first a monochromatic light beam from a semiconductor laser LD is divided into two light beams L1 and L2 by the polarization beam splitter BS1. The light beams L1 and L2 are made to enter the acoustic optical modulators AO1 and AO2, respectively. Frequencies $f_1$ and $f_2$ of outgoing light beams whose polarization planes are tilted by 90° relative to each other are shifted so that the frequencies differ to an extent that the beat signals thereof can be electrically observed. The light beams are merged by the half mirror HM.

The merged light beam is divided into two beams by a beam splitter BS3. The transmitted light beam is reflected by a mirror MR3. The beams enter perpendicularly to the diffraction grating GS at points P5 and P3, respectively, and are diffracted. To extract light beams only of frequency $f_1$ for +first-order light beam L7 diffracted at point P5, and light beams only of frequency $f_2$ for −first-order light beam L8, polarization filters PF5 and PF6 are disposed inside the optical paths for the light beams L7 and L8, respectively. Similarly, to extract light beams only of frequency $f_2$ for +first-order light beam L5 diffracted at point P3 and light beams only of frequency $f_1$ for −first-order light beam L6, polarization filters PF3 and PF4 are disposed inside the optical paths for the light beams L5 and L6, respectively. The light beams L7, L8, L5 and L6 enter corner cube prisms CC5, CC6, CC3 and CC4, respectively, are reflected in a direction parallel and opposite to the incidence direction, are made to return to points P6 and P4 on the diffraction grating GS, are diffracted a second time at the same order as that of the first diffraction to become one light beam, interfere with each other and enter the photoreceptor element PD2. The light beams are diffracted a second time at the same order as that of the first diffraction at points P6 and P4. Two light beams are merged at each of these two points to become one light beam. The merged light beam from P6 being made to enter the photoreceptor element PD3, and the merged light beam from P4 being made to enter the photoreceptor element PD4. Polarization plates PP3 and PP4 whose polarization orientations are tilted by 45° to cause the light beams to interfere with each other with their polarization planes aligned are disposed at a location before the photoreceptor element PD3 and PD4, respectively.

There is a phase lead of one wavelength in the phases of the +first-order light beams L7 and L5 for a displacement corresponding to one pitch of the diffraction grating GS along the x orientation. There is a phase delay of one wavelength in the phase of the −first-order light beams L8 and L6. As these light beams are once more reflected by corner cube prisms and diffracted at the same order as before, a phase difference for four wavelengths is added to the phase of the merged light beams L7 and L8 when the light beams are merged again at point P6. Also, a phase difference for four wavelengths is added to the light beams L5 and L6 merged at P4.

If it is assumed that $w_1=2\pi f_1$ and $w_2=2\pi f_2$, as described above, the light beam L1 is expressed as $u_1 = a \cdot \exp\{i(w_1 t)\}$, and the light beam L2 is expressed as $u_2 = b \cdot \exp\{i(w_2 t)\}$. The phase $\delta$ corresponding to the amount of movement x of diffraction grating GS is expressed as follows with the grating constant of the diffraction grating GS as P:

$$\delta = \frac{2\pi x}{P}$$

Since the phase $\delta$ of the diffraction grating GS is added to the +first-order light beam L7 each time it is diffracted and +first-order diffracted a total of two times, the light beam can be expressed by the following equation when it is incident on the photoreceptor element PD3:

$$u''_1 = a'' \exp\{i(w_1 t + 2\delta)\}$$

where $a''$ is a constant. Since the phase $\delta$ of the diffraction grating GS is subtracted from the −first-order light beam L8 each time it is diffracted and finally the −first-order beam is diffracted two times, a light beam expressed as $$u''_2 = b'' \exp\{i(w_2 t - 2\delta)\}$$

(where b' is a constant) is incident on the photoreceptor element PD3. Therefore, an optical heterodyne signal obtained by the photoreceptor element PD3 is expressed as follows:

$$I_{PD3} = a''^2 + b''^2 + 2a''b'' \cos\{(w_1-w_2)t+4\delta\}$$

The frequency of this signal is the same as the difference between $f_1$ and $f_2$. The phase thereof is added because of diffraction by an amount $4\delta$ proportional to the amount of movement of the diffraction grating GS. Since the phase $\delta$ of the diffraction grating GS is added to the +first-order light beam L5 each time it is diffracted and the +first-order beam is diffracted a total of two times, the following equation can be obtained when the light beam is incident on the photoreceptor element PD4:

$$u'''_2 = b''' \exp\{i(w_2 t + 2\delta)\}$$

where $b'''$ is a constant. Since the phase $\delta$ of the diffraction grating GS is subtracted from the −first-order light beam L6 each time it is diffracted and finally −first-order beam is diffracted two times, a light beam expressed as $$u'''_1 = a''' \exp\{i(w_1 t - 2\delta)\}$$

(where $a'''$ is a constant) is incident on the photoreceptor element PD4. Therefore, an optical heterodyne signal obtained by the photoreceptor element PD4 is expressed as follows:

$$I_{PD4} = a'''^2 + b'''^2 + 2a'''b''' \cos\{(w_1-w_2)t-4\delta\}$$

The frequency of this signal is the same as that obtained by the photoreceptor element PD3, and an amount $4\delta$ proportional to the amount of movement of the diffraction grating GS is subtracted by diffraction from the phase. Two optical heterodyne signals obtained by the photoreceptor elements PD3 and PD4 are input to the phase difference detector PDC. The phase difference between the signals denoted as $\theta$ is detected by the detector PDC to measure the amount of movement of the diffraction grating GS. If the grating constant of the diffraction grating GS is set at 1.6 μm and the amount of movement of diffraction grating GS is denoted as x, the following relation is satisfied:

$$\theta = 8\delta = 8 \times \frac{2\pi x}{1.6} \text{ [rad]}$$

Therefore, when a phase deviation of one cycle, i.e., $8\delta = 2\pi$ [rad], is detected, it is clear that the diffraction grating GS is moved by 1.6 μm÷8=0.2 μm. This means that the amount of a displacement which can be detected by a phase difference of one cycle is one half that for the above-mentioned apparatus of FIG. 1. Accordingly, even if a phase difference detector having the same resolution is used, a minimum detection displacement amount of the apparatus of this embodiment is one half that of the apparatus of FIG. 1, and a higher resolution is obtained. The use of the above-mentioned phase difference detector capable of resolving up to 0.2° permits a displacement up to 0.11 [nm] to be measured theoretically.

Figure 3:
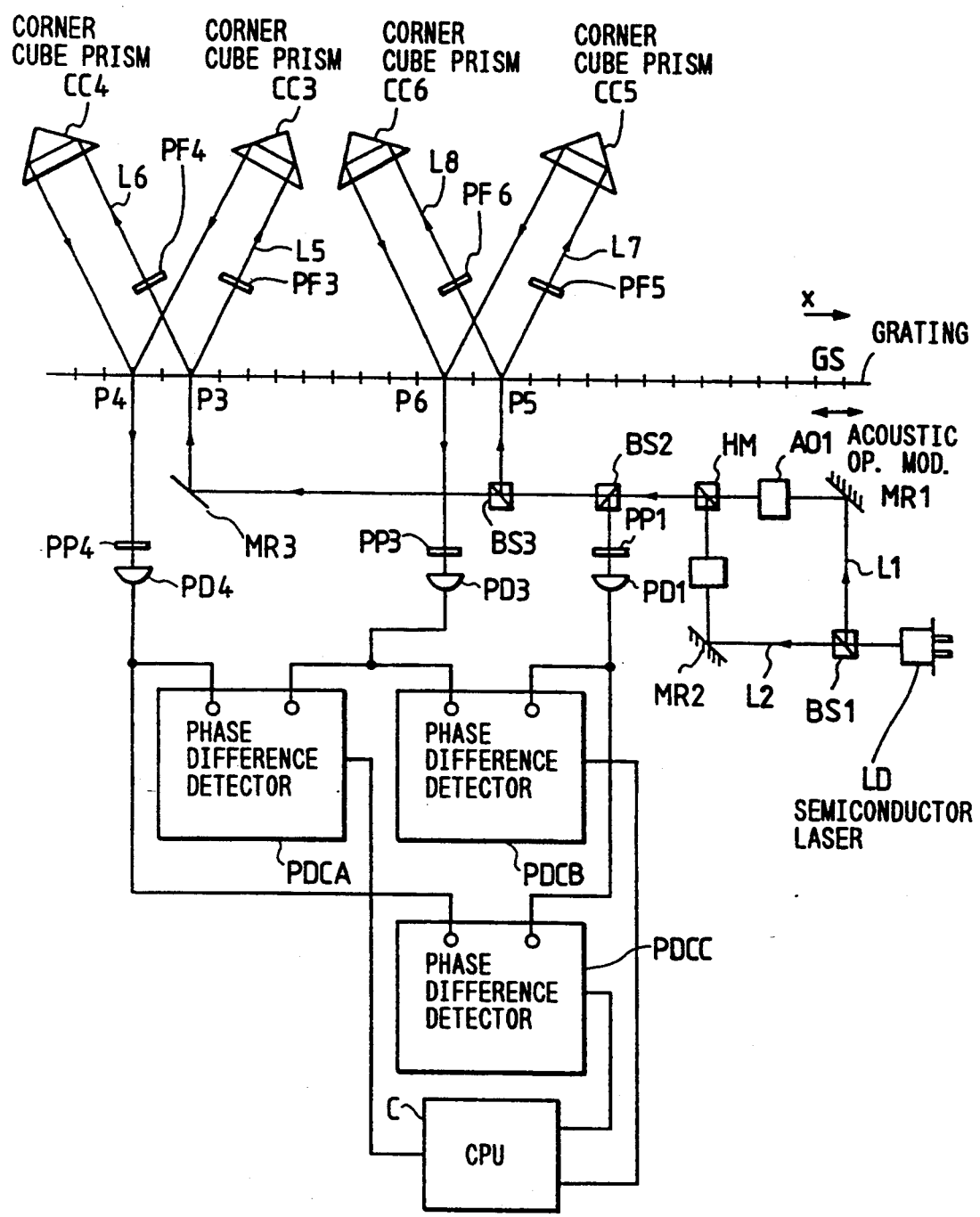
FIG. 3 is a schematic view of a length measuring apparatus of a second embodiment of the present invention.

FIG. 3 shows the second embodiment of the present invention. Although in this embodiment, the optical system around diffraction gratings extracts in the same form as in the eleventh embodiment, a reference signal is extracted and the method of detecting a phase difference is modified. Components which are the same as those described above are given the same reference numerals below.

In FIG. 3, first a monochromatic light beam from the semiconductor laser LD is divided into two light beams L1 and L2 by a polarization beam splitter BS1. The light beams L1 and L2 are made to enter acoustic optical modulators AO1 and AO2, respectively. Frequencies $f_1$ and $f_2$ of outgoing light beams whose polarization planes are tilted by 90° relative to each other are shifted so that the frequencies differ to an extent that the beat signals thereof can be electrically observed. The light beams are merged by the half mirror HM.

A part of this merged light beam is extracted by the beam splitter BS2, and an optical heterodyne signal is obtained as a reference signal by the photoreceptor element PD1. To cause the polarization planes of the two light beams to be aligned and to cause the light beams to be made to interfere with each other at that time, the polarization plate PP1 whose polarization orientation is tilted by 45° is inserted at a location before the PD1.

The remaining light beam divided by BS2 is further divided into two by the beam splitter BS3. The transmitted light beams from beam splitter BS3 are reflected by the mirror MR3, and the transmitted and reflected light beams enter the diffraction grating GS perpendicularly at points P5 and P3, respectively, and are diffracted. To extract light beams only of frequency $f_1$ for +first-order light beam L7 diffracted at point P5 and light beams only of frequency $f_2$ for −first-order light beam L8, polarization filters PF5 and PF6 are disposed inside the optical paths for the light beams L7 and L8, respectively. Similarly, to extract light beams only of frequency $f_2$ for +first-order light beam L5 diffracted at point P3 and light beams only of frequency $f_1$ for −first-order light beam L6, polarization filters PF3 and PF4 are disposed inside the optical paths for the light beams L5 and L6, respectively. The light beams L7, L8, L5 and L6 enter corner cube prisms CC5, CC6, CC3 and CC4, respectively, are each reflected in a direction parallel and opposite to the incidence direction, respectively, and are made to return to points P6 and P4 on the diffraction grating GS. The light beams are diffracted at these two points a second time at the same order as that of the first diffraction to become one light beam. The merged light beams from point P6 enter the photoreceptor element PD3, and the merged light beams from point P4 enter the photoreceptor element PD4. To cause the polarization planes of the two merged light beams to be aligned and to cause the light beams to interfere with each other, polarization plates PP3 and PP4 whose polarization orientations are tilted by 45° are inserted at locations before the photoreceptor elements PD3 and PD4, respectively.

There is a phase lead of one wavelength in the phase of the +first-order light beams L7 and L5 for a displacement corresponding to one pitch of the diffraction grating GS along the x orientation. There is a phase delay of one wavelength in the phase of the −first-order light beam L8 and L6. As each of these light beams is reflected by the corner cube prisms and diffracted once more at the same order as before, a phase difference for four wavelengths is added to the phase of the merged light beams L7 and L8 when the light beams are merged at point P6. Also, a phase difference for four wavelengths is added to the phase of the merged light beams L5 and L6 when the light beams are merged at point P4.

As described above, if a light beam having a frequency $f_1$ is represented by $u_1 = a \cdot \exp\{i(w_1 t)\}$, and if a light beam having a frequency $f_2$ is represented by $u_2 = b \cdot \exp\{i(w_2 t)\}$, an optical heterodyne signal obtained by the photoreceptor element PD1 as a reference signal is expressed as follows:

$$I_{REF} = a^2 + b^2 + 2ab \cos(w_1 - w_2)t.$$

Since, in the above equation, $w_1 = 2\pi f_1$ and $w_2 = 2\pi f_2$, this signal is a signal having a frequency corresponding to the difference between $f_1$ and $f_2$. The phase $\delta$ of the diffraction grating GS corresponding to the amount x of movement of the diffraction grating GS is expressed as follows, as was previously mentioned:

$$\delta = \frac{2\pi x}{P}$$

Since the phase $\delta$ of the diffraction grating GS is added to the +first-order light beam L7 each time it is diffracted and the finally +first-order diffracted beam is diffracted two times, the following expression can be obtained when the light beam is incident on the photoreceptor element PD3:

$$u''_1 = a'' \exp\{i(w_1 t + 2\delta)\}.$$

Since the phase $\delta$ of the diffraction grating GS is subtracted from the −first-order light beam L8 each time it is diffracted and the finally −first-order diffracted beam is diffracted two times, a light beam expressed as $$u''_2 = b'' \exp\{i(w_2 t - 2\delta)\}$$

is incident on the photoreceptor element PD3. Therefore, an optical heterodyne signal obtained by the photoreceptor element PD3 is expressed as follows:

$$I_{PD3} = a''^2 + b''^2 + 2a''b'' \cos\{(w_1 - w_2)t + 4\delta\}.$$

The frequency of this signal is the same as that of the reference signal. The phase thereof leads that of the reference signal, by an amount $4\delta$ proportional to the amount of movement of the diffraction grating GS. Since the phase $\delta$ of the diffraction grating GS is added to the +first-order light beam L5 each time it is diffracted and the finally +first-order diffracted beam is diffracted two times, the following expression can be made when the light beam is incident on the photoreceptor element PD4:

$$u'''_2 = b''' \exp\{i(w_2 t + 2\delta)\}.$$

Since the phase $\delta$ of the diffraction grating GS is subtracted from the −first-order light beam L6 each time it is diffracted and the finally −first-order diffracted beam is diffracted two times, a light beam expressed as $$u'''_1 = a''' \exp\{i(w_1 t - 2\delta)\}$$

is incident on the photoreceptor element PD4. Therefore, an optical heterodyne signal obtained by the photoreceptor element PD4 is expressed as follows:

$$I_{PD4} = a'''^2 + b'''^2 + 2a'''b''' \cos\{(w_1 - w_2)t - 4\delta\}$$

The frequency of this signal is the same as that of the reference signal, and the phase thereof is delayed with respect to that of the reference signal by an amount $4\delta$ proportional to the amount of movement of the diffraction grating GS. Two optical heterodyne signals obtained by the photoreceptor elements PD3 and PD4 are input to the phase difference detector PDCA. The phase difference between the signals (denoted as $\theta$) is detected by the detector PDCA to measure the amount of movement of the diffraction grating GS. If the grating constant of the diffraction grating GS is set at 1.6 μm and the amount of movement of diffraction grating GS is denoted as x, the following relation is satisfied:

$$\theta = 8\delta = 8 \times \frac{2\pi x}{1.6} \text{ [rad]}$$

Therefore, when a phase deviation of $8\delta = 2\pi$ [rad] is detected, it is clear that the diffraction grating GS is moved by 1.6 μm ÷ 8 = 0.2 μm. This is the same as in the first embodiment. The use of the above-mentioned phase difference detector capable of resolving up to 0.2° permits a displacement up to 0.11 [nm] to be measured theoretically. In this embodiment, the output from the detector PDCA is input to a central processing unit (CPU) C, whereby the signals are processed and an amount of displacement is computed.

Photoreceptor elements PD1 and PD3 detect a phase difference in a phase difference detector PDCB in the same manner as above and compare a phase difference obtained by a phase difference detector PDCC from the photoreceptor elements PD1 and PD4. At that time, when there is a temperature difference between two optical paths because of, for example, air disturbance, though the absolute values of the two phase differences should theoretically be equal, being 4δ, these two phase differences will not be equal. Therefore, when a difference between these phase differences is detected by the CPU, it is detected that the measured value is erroneous. When a difference between these phase differences exceeds an allowable value, erroneous inputting of a measured value can be prevented by the CPU performing the following: (1) sending a command signal to an unillustrated actuator in order to stop a fine movement of the diffraction grating, that is, the measurement is temporarily stopped, or (2) erasing a signal from the phase difference detector PDCA at that time.

Figure 4:
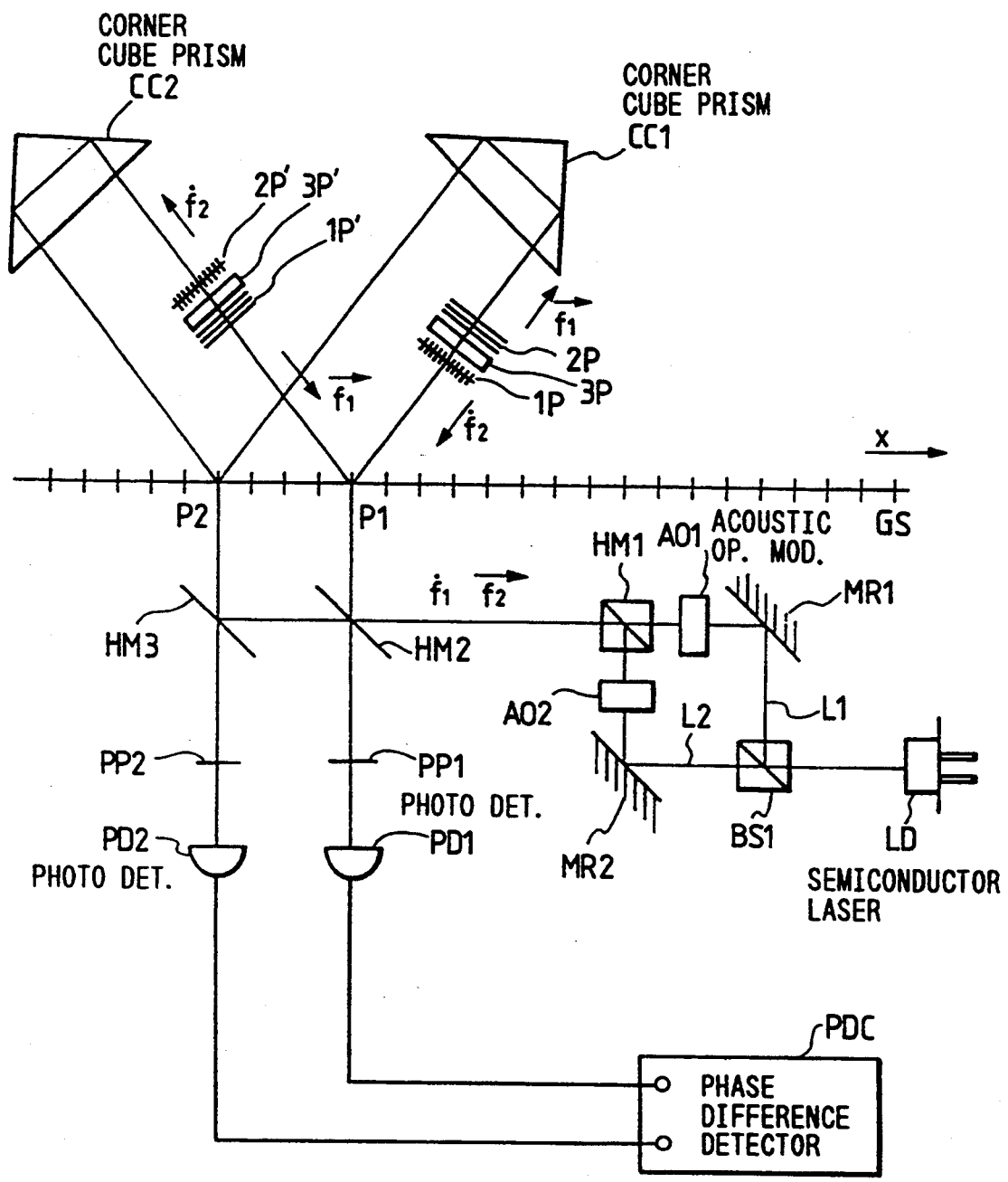
FIG. 4 is a schematic view of a length measuring apparatus of a third embodiment of the present invention.

FIG. 4 shows the third embodiment of the present invention, in which the construction of the apparatus shown in FIG. 4 is simplified by providing one optical path, whereas previous embodiments have two similar optical paths.

In FIG. 4, first a monochromatic light beam from the semiconductor laser LD is divided into two light beams L1 and L2 by the polarization beam splitter BS1. The light beams L1 and L2 are made to enter acoustic optical modulators AO1 and AO2, respectively. Frequencies $f_1$ and $f_2$ of the outgoing light beams whose polarization planes are tilted by 90° relative to each other are shifted so that the frequencies differ to an extent that the beat signals thereof can be electrically observed. The light beams are merged by the half mirror HM1.

This merged light beam is divided into two by a half mirror HM2. One light beam is made to enter the diffraction grating GS at point P1. The +first-order diffracted light beam path through an optical system formed by two polarization plates 1P and 2P shown in FIG. 5, whose polarization directions intersect at right angles with respect to each other, and a λ/2 plate 3P. Only the S-polarized diffracted light beams having frequency $f_1$ are converted into P-polarized light beams, are made to enter the corner cube prism CC1, are reflected and are made to enter point P2 on the diffraction grating GS. In contrast, −first-order diffracted light beams are made to enter an optical system such as the optical system shown in FIG. 5 tilted axially by 90° (i.e., the optical system formed of polarization plates 1P' and 2P', and a λ/2 plate 3P'). Only the P-polarized diffracted light beams having frequency $f_2$ are converted into S-polarized light beams, made to enter the corner cube prism CC2, reflected and made to enter point P2 on the diffraction grating GS. The two light beams which have entered the point P2 are diffracted a second time at the same order as at the first time, are merged and transmitted through the half mirror HM3 as one light beam, and enter the photoelectric conversion element PD2. To cause the polarization planes of the two light beams to be aligned and to cause the light beams to interfere with each other, a polarization plate PP2 whose polarization orientation is tilted by 45° is inserted at a location before the PD2. There is a phase lead of one wavelength in the phase of the +first-order light beam for a displacement corresponding to one pitch of the diffraction grating GS along the x orientation. There is a phase lag of one wavelength in the phase of the −first-order light beam. As these light beams are reflected by the corner cube prisms and diffracted once more at the same order as before, a phase difference for four wavelengths are added to the light beams having a frequencies $f_1$ and $f_2$ when the light beams are merged at point P2.

Figure 5:
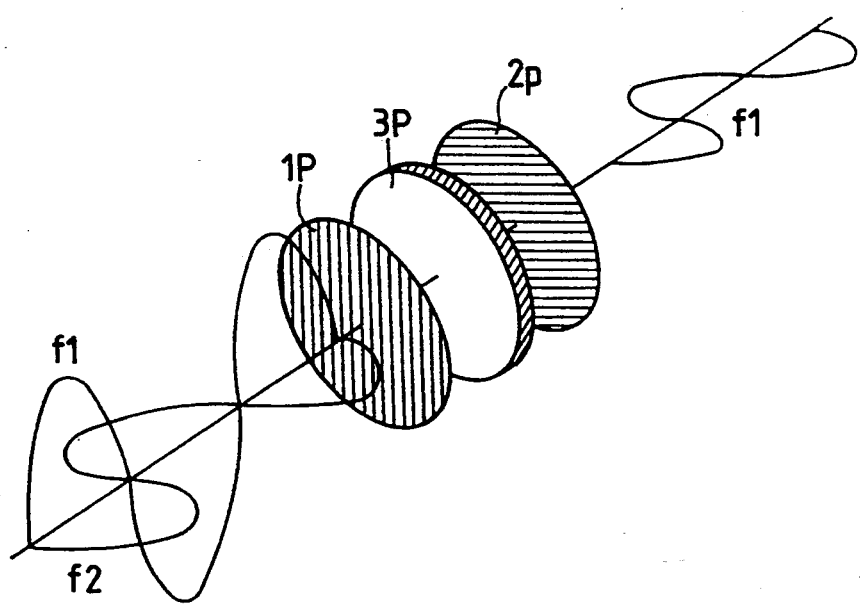
FIG. 5 is a view illustrating the optical system of a part of the third embodiment of the present invention.

The remaining light beams which have been transmitted through the half mirror HM2 are reflected by the half mirror HM3, and made to enter the diffraction grating GS at point P2. The +first-order diffracted light beams are made to enter the corner cube prism CC1, then pass through the optical system such that the optical system shown in FIG. 5 is tilted axially by 90° in a direction opposite to the previous case. The P-polarized diffracted light beams only having a frequency $f_2$ are converted into S-polarized light beams and made to enter the diffraction grating GS at point P2. In contrast, the −first-order diffracted light beams are made to enter the optical system shown in FIG. 5 in a direction opposite to the previous case. The S-polarized diffracted light beams only having a frequency $f_1$ are converted into P-polarized light beams and made to enter the diffraction grating GS at point P1. The two light beams which have entered point P1 are diffracted again and merged. The light beams are transmitted through the half mirror HM2 as one light beam and made to enter the photoelectric conversion element PD1. To cause the polarization planes of the light beams to be aligned and to cause the light beams to interfere with each other, a polarization plate PP1 whose polarization orientation is tilted by 45° is inserted at a location before the PD1.

There is a phase lead of one wavelength in the phase of the +first-order light beams for a displacement corresponding to one pitch of the diffraction grating GS along the x orientation. There is a phase delay of one wavelength in the phase of the −first-order light beams. As these light beams are reflected by the corner cube prisms and diffracted once more at the same order as before, a phase difference for four wavelengths is added to the phase of the merged light beams when the light beams are merged at point P1.

As described above, the light beam having a frequency $f_1$ is expressed as $u_1 = a \cdot \exp\{i(w_1 t)\}$, and the light beam having a frequency $f_2$ is expressed as $u_2 = a \cdot \exp\{i(w_2 t)\}$. Since, in the above equation, $w_1 = 2\pi f_1$ and $w_2 = 2\pi f_2$, the merged light beams form a beat signal with a frequency corresponding to the difference between $f_1$ and $f_2$. The phase δ corresponding to the amount of movement x of diffraction grating GS is expressed as follows with the grating constant of the diffraction grating GS as P:

$$\delta = \frac{2\pi x}{P}$$

Since the phase δ of the diffraction grating GS is added to the +first-order light beam diffracted at point P1 having a frequency $f_1$ each time it is diffracted and the finally +first-order diffracted beam is diffracted two times, the following expression can be made when the light beam is incident on the photoreceptor element PD2:

$$u''_1 = a'' \cdot \exp\{i(w_1 t + 2\delta)\}.$$

Since the phase δ of the diffraction grating GS is subtracted from the −first-order light beam diffracted at point P1 having a frequency $f_2$ each time it is diffracted and finally −first-order diffracted beam is diffracted two times, a light beam expressed as $$u''_2 = b'' \cdot \exp\{i(w_2 t - 2\delta)\}$$

is incident on the photoreceptor element PD2. Therefore, an optical heterodyne signal obtained by the photoreceptor element PD2 is expressed as follows:

$$I_{PD2} = a''^2 + b''^2 + 2a''b'' \cos\{(w_1 - w_2)t + 4\delta\}$$

The frequency of this signal is the same as the difference between $f_1$ and $f_2$. The phase thereof leads by an amount $4\delta$ proportional to the amount of movement of the diffraction grating GS in comparison with a case before the light beam is made to enter the diffraction grating GS. Since the phase $\delta$ of the diffraction grating GS is added to the +first-order light beam, diffracted at point P2, having a frequency $f_2$ each time it is diffracted and the finally +first-order diffracted beam is diffracted two times, the following equation can be obtained when the light beam is incident on the photoreceptor element PD1:

$$u'''_2 = b''' \exp\{i(w_2 t + 2\delta)\}.$$

Since the phase $\delta$ of the diffraction grating GS is subtracted from the −first-order light beam, diffracted at point P2, having a frequency $f_1$ each time it is diffracted and the finally −first-order diffracted beam is diffracted two times, a light beam expressed as $$u'''_1 = a''' \exp\{i(w_1 t - 2\delta)\}$$

is incident on the photoreceptor element PD1. Therefore, an optical heterodyne signal obtained by the photoreceptor element PD1 is expressed as follows:

$$I_{PD1} = a'''^2 + b'''^2 + 2a'''b''' \cos\{(w_1 - w_2)t - 4\delta\}$$

The frequency of this signal is also equal to the difference between $f_1$ and $f_2$. The phase thereof is delayed by an amount $4\delta$ proportional to the amount of movement of the diffraction grating GS in comparison with a case before the light beam is made to enter the diffraction grating GS. The two optical heterodyne signals obtained by the photoreceptor elements PD1 and PD2 are input to the phase difference detector PDC. The phase difference between the signals (denoted as $\theta$) is detected by the detector PDC to measure the amount of movement of the diffraction grating GS.

If the grating constant of the diffraction grating GS is set at 1.6 μm and the amount of movement of diffraction grating GS is denoted as x, the following relation is satisfied:

$$\theta = 8\delta = 8 \times \frac{2\pi x}{1.6} \text{ [rad]}$$

Therefore, when a phase deviation of one cycle, i.e., $8\delta = 2\pi$ [rad], is detected, it is clear that the diffraction grating GS is moved by 1.6 μm ÷ 8 = 0.2 μm. Detection of an amount of movement with a high degree of resolution is made possible by making the minimum detection phase difference sufficiently smaller than one cycle. The use of the phase difference detector capable of resolving up to 0.2° permits a displacement to 0.11 [nm] to be measured theoretically.

Figure 6:
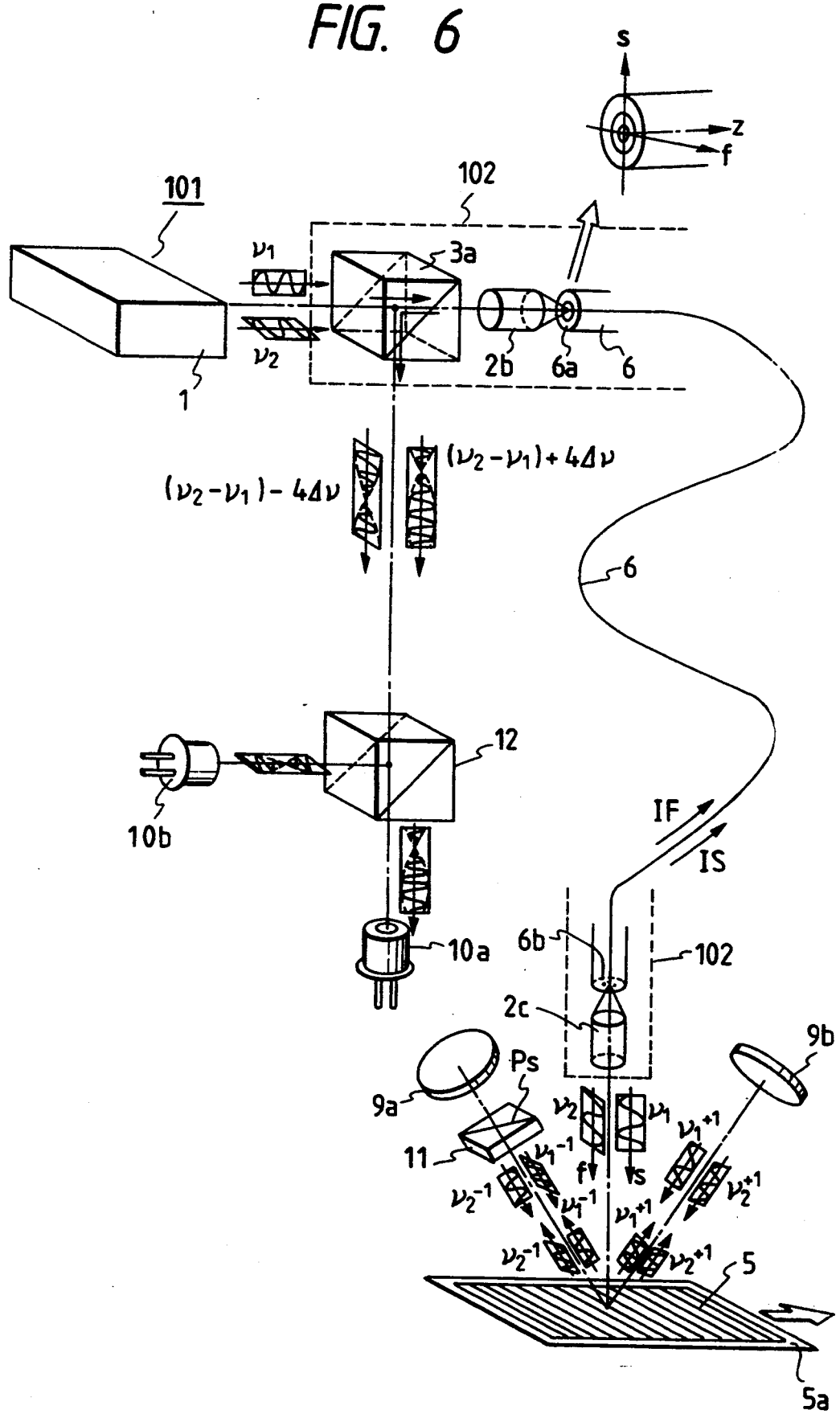
FIG. 6 is a schematic view of the principal part of a fourth embodiment of the present invention.

FIG. 6 is a view schematically showing the principal part of the fourth embodiment of the present invention. In FIG. 6, arrows indicate the orientation of the traveling light beams and sinusoidal wave marks designate the plane of polarization. A reference numeral 101 designates light source means having a light source 1 such as two-frequency oscillation laser for oscillating light beams of at least two frequencies ($\nu_1$ and $\nu_2$) (wavelengths).

From the light source 1, there are emitted the two light beams ($\nu_1$ and $\nu_2$) with overlapping each frequency differing from the other in substantially parallel with polarization planes orthogonal to each other. These two light beams ($\nu_1$ and $\nu_2$) are transmitted through a non-polarized beam splitter 3a and converged by a coupling lens 2b to enter a first end (incidence surface) 6a of a polarization maintaining optical fiber 6. At this juncture, the optical axes (axis s and axis f) of the polarization maintaining optical fiber 6 and the polarization planes of the two light beams ($\nu_1$ and $\nu_2$) are positioned so that they are matched. (Any combinations will do.)

Note that the polarization maintaining optical fiber 6 is for propagating the light beams in a state that the polarized condition is maintained. Also, the optical axes of the polarization maintaining optical fiber 6 are arranged to define the one having the direction of a faster propagation velocity of light waves as an axis f while the one having the slower direction as an axis s.

The light beam having the component of the axis s and the light beam having the component of the axis f emitted from the second end (exit surface) 6b of the polarization maintaining optical fiber 6 corresponds to the light beam $\nu_1$ and light beam $\nu_2$, respectively.

The two light beams ($\nu_1$ and $\nu_2$) from the exit surface 6b of the polarization maintaining optical fiber 6 are made substantially parallel light beams by means of a coupling lens 2c and are allowed to enter the fine grating arrays 5 which are composed of diffraction grating on a scale 5a.

In this respect, each of the elements 3a, 2b, 6, and 2c constitutes one element of the optical means 102 by which the light beams from the light source means 101 enter the scale 5a.

Among a plurality of diffracted lights generated by the fine grating arrays 5, the ±first-order diffracted light, for example, is caused to be reflected by mirrors 9a and 9b to return to the original light path and enter again the fine grating arrays 5 of the scale 5a.

In this case, there is arranged a λ/4 plate 11 on one of the light paths of the −first-order diffracted light in FIG. 6. Then, before passing through this λ/4 plate 11, the −first-order diffracted light shows the following:
 linearly polarized light in parallel with axis s $(s^{-1}) = (\nu_1^{-1})$,
 linearly polarized light in parallel with axis f $(f^{-1}) = (\nu_2^{-1})$,
after being transmitted through the λ/4 plate reciprocally, it is converted into the following:
 linearly polarized light in parallel with axis s $(s^{-1}) = (\nu_2^{-1})$,
 linearly polarized light in parallel with axis f $(f^{-1}) = (\nu_1^{-1})$.

On the other hand, the +first-order diffracted light is as follows:
 linearly polarized light in parallel with axis s $(s^{+1}) = (\nu_1^{+1})$,
 linearly polarized light in parallel with axis f $(f^{+1}) = (\nu_2^{+1})$.

These four light beams are again diffracted by the fine grating arrays 5a. Of these beams, only the +first-order diffracted light ($s^{+1+1}$) and ($f^{+1+1}$) of the +first-order diffracted light, and the −first-order diffracted light ($s^{-1-1}$) and ($f^{-1-1}$) of the −first-order diffracted light enter the coupling lens 2c. In other words, they are the following four light beams:

linearly polarized light in parallel with axis s
($s^{+1+1}$)=($\nu_1{}^{+1+1}$),
linearly polarized light in parallel with axis f
($f^{+1+1}$)=($\nu_2{}^{+1+1}$),
linearly polarized light in parallel with axis s
($s^{-1-1}$)=($\nu_2{}^{-1-1}$),
linearly polarized light in parallel with axis f
($f^{-1-1}$)=($\nu_1{}^{-1-1}$).

At this juncture, there is further interference between the light beams having the same polarization plane and the beams are converted into two kinds of heterodyne signal light beams. In other words, they are the following beams respectively:

heterodyne signal light beam IS of linearly polarized
light in parallel with axis s=($\nu_2{}^{-1-1}$)−($\nu_1{}^{+1+1}$)
heterodyne signal light beam IF of linearly polarized
light in parallel with axis f=($\nu_2{}^{+1+1}$)−($\nu_1{}^{-1-1}$)
where $\nu_2 > \nu_1$. Here, given the frequency deviation due to the ±first-order diffraction light as ±Δ$\nu$, they are expressed in the following equation:

$$(\nu_2{}^{-1-1}) - (\nu_1{}^{+1+1}) = (\nu_2 - \nu_1) - 4\Delta\nu$$

$$(\nu_2{}^{+1+1}) - (\nu_1{}^{-1-1}) = (\nu_2 - \nu_1) + 4\Delta\nu$$

(The frequency deviations of the two heterodyne signal light beams are in the directions opposite to each other and are equal in quantity.)

The two heterodyne signal light beams IS and IF, entered again into the second end 6b of the polarization maintaining optical fiber 6 by means of the coupling lens 2c, have planes of polarization which are parallel with the axis s and axis f, respectively. They are then allowed to match the optical axis of the polarization maintaining optical fiber to enter it, thus propagating independently (without any mutual interference) in the polarization maintaining optical fiber 6.

Then, the two heterodyne signal light beams IS and IF emitted from the first end 6a of the polarization maintaining optical fiber 6 are made substantially parallel light beams by means of the coupling lens 2b while each of polarization planes is kept to be orthogonal to each other, and are reflected at the non-polarized beam splitter 3a, and are separated per polarized light component by means of the polarized beam splitter 12. They are thus restored to the two brightness signal light beams which repeat bright and dark with the substantial difference frequency of the two oscillation frequencies, and are converted into electrical signals by photoelectric devices 10a and 10b serving as a photoelectric transducer 105 (after its amplitudes are amplified), thus outputting the modulated two phase signals which serve as an encoder utilizing heterodyne interference.

In the present embodiment, the shifting amount, shifting direction, and other information concerning the movement of the scale 5a are detected by using the signals obtained by the photoelectric transducing means 105 (photoelectric devices 10a and 10b). In other words, the absolute value of the phase difference $\theta = 8\Delta\nu$ between both signals designates the shifting amount, and the positive and negative signs designate the shifting directions. The information can be obtained by inputting both signals into a phase difference detector, for example. Here, given the grating constant of the diffraction gratings as P and the shifting amount as X, the information is obtainable by the following equation:

$$\theta = 8\Delta\nu = \frac{16\pi X}{P}$$

Thus, in the present embodiment, a two-frequency oscillation laser, one polarization maintaining optical fiber, and each of the elements are appropriately arranged. In other words, before returning the two order diffracted lights generated from the fine grating arrays of the scale to the polarization maintaining optical fiber, a crystal optical element 11 for replacing the polarization planes is disposed in at least one of the optical paths having different diffraction order (m and n), whereby the m-th diffracted light and n-th diffracted light are converted into interference signals so that the polarization planes are matched in correspondence to the light beams of oscillation frequencies ($\nu_1$ and $\nu_2$) differing from each other. Further, they enter the polarization maintaining optical fiber so as to be in parallel with either one of its optical axes (axis s and axis f) to propagate therein. Thus, it is possible to detect the information concerning the movement of the scale 5a with a high precision while implementing the simplification of the entire body of the apparatus.

Figure 7:
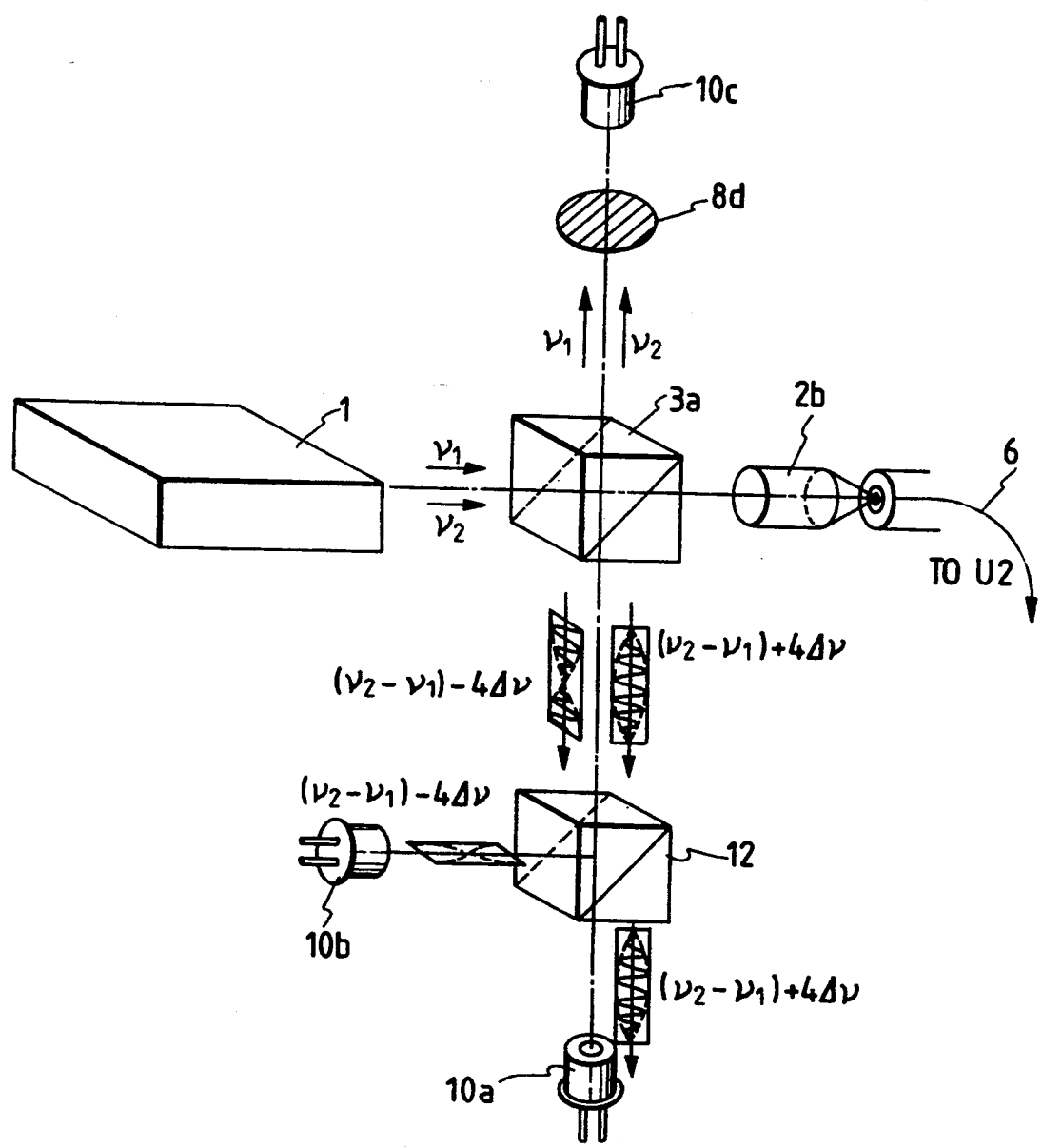
FIG. 7 is a view illustrating a partial variation of the part shown in FIG. 6.

In the present embodiment, it may be possible to utilize reflected light beams from the non-polarized beam splitter 3a as shown in FIG. 7 as reference heterodyne signals (signals which are not affected by any phase modulation due to movement of the scale 5a=difference signal between the oscillation frequencies of the two-frequency laser). The reference signals here can be used to monitor the beat signal generated by the two-wavelength light from the light source, for example.

Such kind of apparatus is shown in FIG. 7, in which the two light beams are transmitted through a polarized plate (analyzer) 8d which is set to have transmission characteristics in an orientation of 45° with respect to the polarization orientation of the two light beams ($\nu_1$ and $\nu_2$), thereby creating the interference phenomenon between the polarized light components common to both light beams.

Then, the light beams are converted into the brightness signal light beams which repeat bright and dark by the difference frequency between the oscillation frequencies of the two light beams ($\nu_1$ and $\nu_2$). The brightness signal light beams are converted into electrical signals by means of photoelectric device 10c (after the amplitudes are amplified), and it may be possible to utilize them with the output of reference signals.

In this respect, according to the present invention, it may also be possible to apply the following modification of each element in the foregoing forth embodiment:

(4-a) It is possible to utilize the combination of diffracted lights of orders other than the ±first-order diffracted light for the diffracted light from the fine grating arrays on the scale.

(4-b) Instead of the prism type beam splitter, it is possible to use mirror type beam splitting means having the same function.

Figure 8:
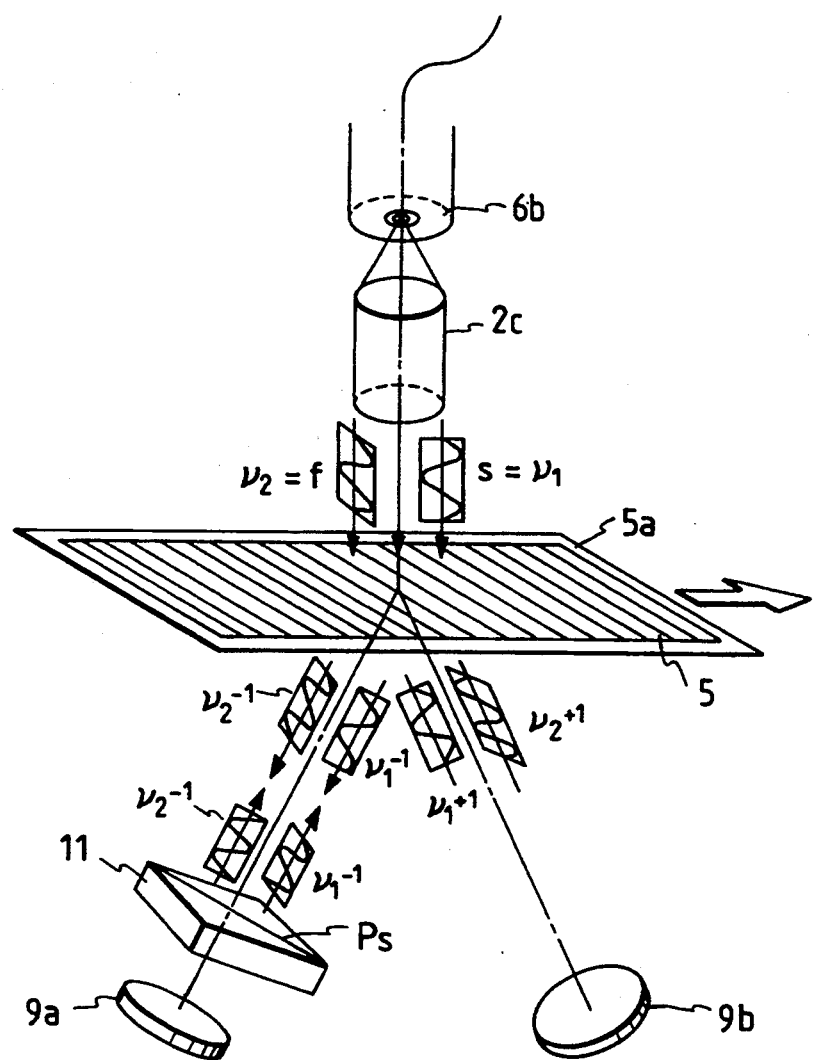
FIG. 8 is a view illustrating a partial variation of the part shown in FIG. 6.

(4-c) The two diffraction lights obtainable from the fine grating arrays (diffraction gratings) on the scale are not necessarily of a reflective type, but as shown in FIG. 8, they can be of a transmission type. FIG. 13 shows only the vicinity of the scale 5a. Also, the same reference marks are given to the same elements as those appearing in FIG. 6.

(4-d) The two light beams from the polarization maintaining optical fiber 6 are firstly divided into two light beams by utilizing a prism having the divided planes BS and then it may be possible to allow them to enter the fine grating arrays 5 of the scale 5a.

Figure 9:
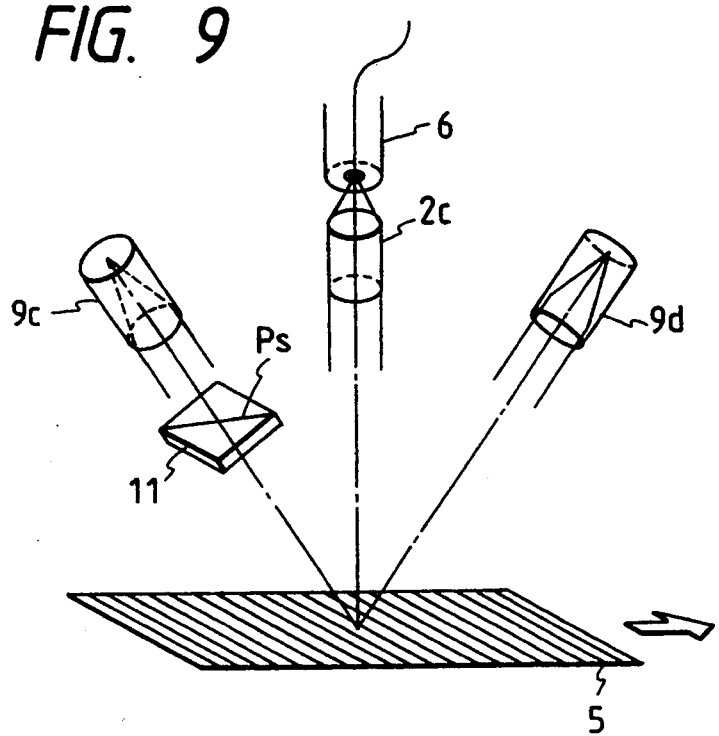
FIG. 9 is a view illustrating a partial variation of the part shown in FIG. 6.
Figure 10:
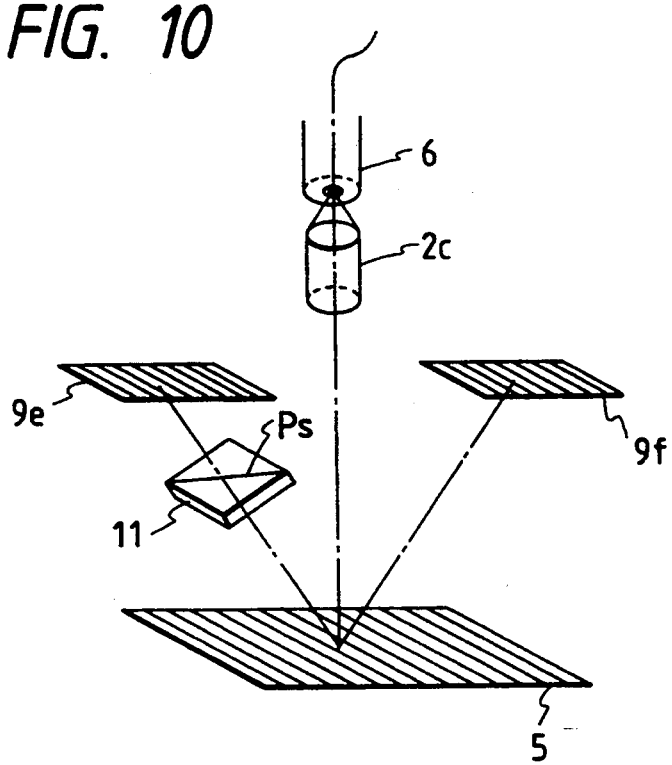
FIG. 10 is a view illustrating a partial variation of the part shown in FIG. 6.

(4-e) Instead of the mirrors 9a and 9b, it may be possible to use cat eye optical elements 9c and 9d as shown in FIG. 9 or diffraction grating reflection elements 9e and 9f as shown in FIG. 10, or corner cubes and the like. In this way, the optical path deviation due to the variation of the wavelengths of the light beam from the light source can be corrected. In this respect, if the diffraction grating reflective elements 9e and 9f are diffraction gratings of a reflective type, it is possible to restore the original optical path provided that they are made periodic gratings having pitch half the pitch of the fine grating arrays 5 of the scale.

(4-f) The structure of the polarization maintaining optical fiber can be of an oval core type, PANDA type, or the like at its cross-section in addition to the so-called oval clad type as shown in FIG. 9.

(4-g) The fine grating arrays on the scale are not necessarily of a liner type. If, for example, the type in which the radial gratings are recorded on a rotary disc can be used, such a type will be applicable as a rotary encoder as it is.

Figure 11:
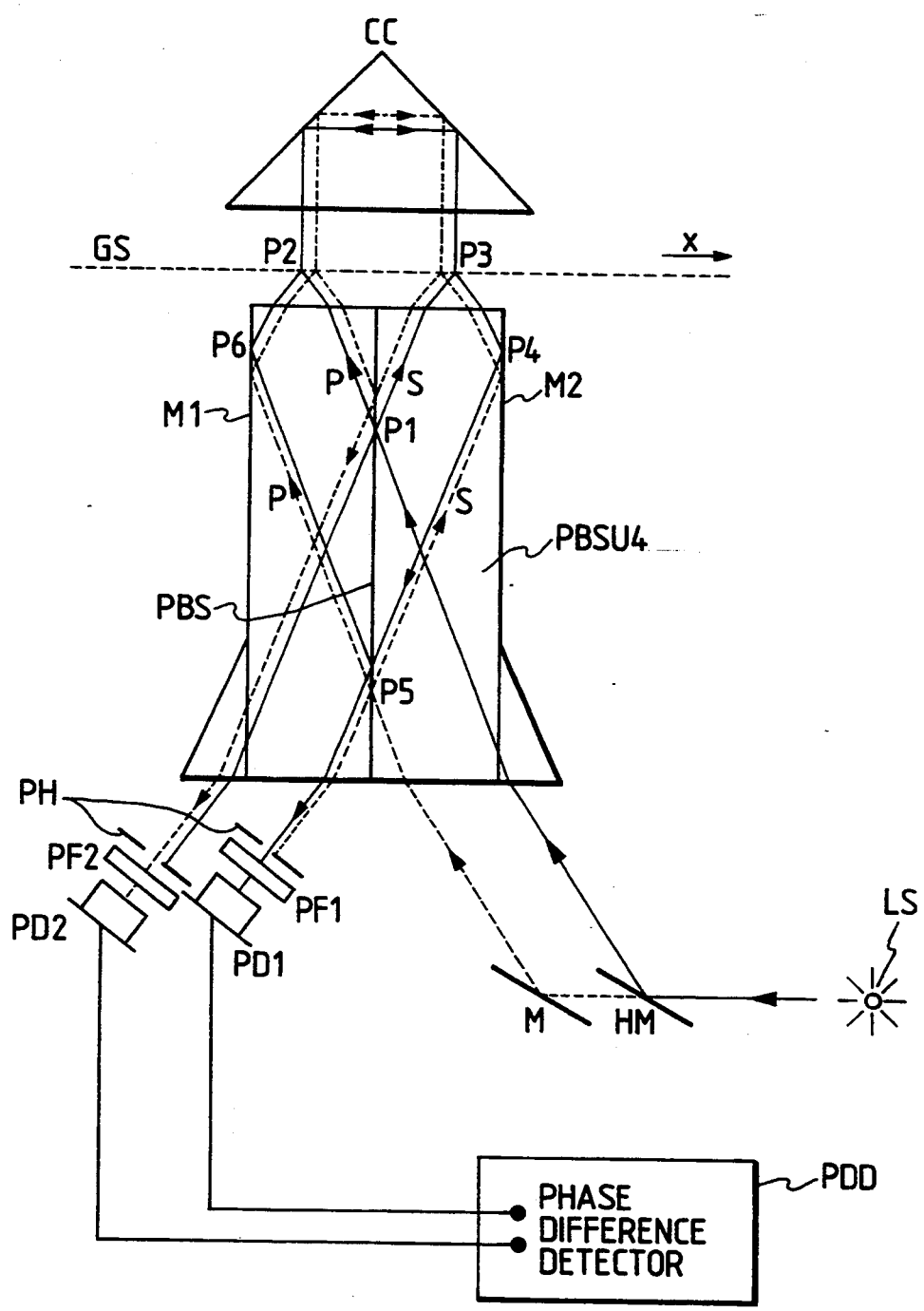
FIG. 11 is a schematic view of the principal part of a fifth embodiment of the present invention.

FIG. 11 is a view illustrating a fifth embodiment of the present invention.

A light from a light source LS for emitting a light beam having the orthogonal polarization planes of two wavelengths is divided into two beams by means of a half mirror HM. One of the beams passes along a light path indicated by solid lines. In other words, from the light source LS such as a Zeeman laser, or one for emitting a two-frequency laser light having the frequencies of two linearly polarized orthogonal lights which are different enough to electrically observe the beat signals thereof, the light beam is firstly emitted and then reflected at the half mirror HM to be incident on a polarized light beam splitter unit (PBS unit) PBSU 4 as shown in FIG. 11.

This PBS unit has the polarized beam splitter (PBS) in its center, therefore, the light beam is divided into the transmitting wave P and reflecting wave S at a point P1. The two linearly polarization lights are incident on the diffraction gratings GS at points P2 and P3, respectively, after emitted from the PBS unit PBSU 4. At this juncture, the angle of the light beam from the light source is adjusted in such a manner that the +first-order diffracted light of the wave P is emitted at the point P2 and the −first-order diffracted light of the wave S is emitted at the point P3 both in the direction perpendicular to the diffraction gratings GS, and the light reflected by the corner cube prism CC is diffracted at the points P3 and P2 on the diffraction gratings GS, respectively.

The +first-order diffracted light of the wave P (the first diffraction) is reflected by the corner prism CC at the point P2 to enter the diffraction gratings GS vertically at the point P3. One of the diffracted lights which has been diffracted two times (+first-order diffracted light) is totally reflected by a mirror M2 at a point P4. Although this enters the polarized light beam splitter PBS again at a point P5, it is transmitted because this light is of the wave P (that is, emitted to the side opposite to the light source LS) and then it enters the light receiving element PD1 from the PBS unit PBSU 4 through a polarization filter PF1. The other diffracted light having been diffracted two times (−first-order diffraction light) is also of the wave P, therefore, is transmitted through the PBS at the point P1 and emitted in the direction toward a polarization filter PF2 and an element PD2.

Meanwhile, the −first-order diffracted light of the wave S (the first diffraction) is reflected at the point P3 by the corner cube prism CC and enters the diffraction gratings GS vertically at the point P2. One of the diffracted light which has been diffracted two times (−first-order diffracted light) is totally reflected by a mirror M1 at a point P6. This again enters the polarized light beam splitter PBS at a point P5, then this light is reflected since it is the wave S (that is, emitted to the side opposite to the light source LS). Also, at the same time, this wave is synthesized with the foregoing P wave (twice +primarily diffracted light beam) at the point P5 and enters the light receiving element PD1 through the polarization filter PF1. The other light diffracted two times (+first-order diffracted light) at the point P2 is also of the wave S and is therefore reflected by the polarized light beam splitter PBS at the point P1. At this juncture, this light is synthesized with the foregoing P wave (the light beam which is +first-order diffracted and next −first-order diffracted) and is emitted in the direction toward the polarization filter PF2 and light receiving element PD2. However, this light does not enter the light receiving element PD2 because it is shielded by means of a pin hole PH as described later.

The signal obtainable from the light receiving element PD1 is optical heterodyne signal with the frequency which is a difference between frequencies of two light beams. In this case, the polarizing orientation of the polarization filters PF1 and PF2 is in the direction having an inclination of 45° with respect to the polarization planes of the wave P and wave S in order to align the polarization planes for interference.

Now, given the frequency of wave P as $f_1$, $\omega_1 = 2\pi f_1$, and the frequency of wave S as $f_2$, $\omega_1 = 2\pi f_1$, the phase $\delta$ of the diffraction grating will be adjusted upon diffracting, and the wave P (two times +first-order diffracted light beam) which enters the light receiving element PD1 will be expressed by the following equation:

$$u'_1 = a' \exp\{i(\omega_1 t + 2\delta)\}$$

and the wave S (two times −first-order diffracted light beam) will be expressed by the following equation:

$$u'_2 = b' \exp\{i(\omega_2 t - 2\delta)\}$$

Therefore, the optical heterodyne signal obtainable from the light receiving element PD1 will be as follows after photoelectric conversion:

$$I_{PD1} = a'^2 + b'^2 + 2a'b' \cos\{(\omega_1 - \omega_2)t + 4\delta)\}$$

The other light separated at the HM enters the light receiving element PD2 with an adjustment of the diffraction grating phase at the time of diffraction after traveling through a mirror M and optical system indicated by dotted lines in FIG. 11. In other words, the wave P and wave S indicated by the dotted lines substantially travel along the optical paths opposite to the optical paths of the wave P and wave S indicated by the solid lines, respectively, from the time they are separated by the polarized light beam splitter PBS to the time they are synthesized. After these waves are synthesized in the vicinity of the point P1, they are directed to the light receiving element PD2. When they enter the PBS unit PBSU 4, these optical paths are slightly deviated in order to avoid any mixture of the light beams indicated by the solid lines into the light receiving element PD2 as described earlier, and a pin hole HP is inserted before the light receiving element PD2. (Before the light receiving element PD1, a pin hole HP is inserted in order to avoid the incidence of the light beam indicated by dotted lines (synthesized wave in the vicinity of the point P5).) The wave P indicated by the dotted lines (two times −first-order diffracted light) is expressed by the following equation:

$$u''_1 = a'' \exp\{i(\omega_1 t - 2\delta)\}$$

and likewise the wave S indicated by dotted lines (two times +first-order diffracted light) is expressed by the following equation:

$$u''_2 = b'' \exp\{i(\omega_2 t + 2\delta)\}$$

Therefore, the optical heterodyne signals obtainable from the light receiving element PD2 will be as follows after photoelectric conversion:

$$I_{PD2} = a''^2 + b''^2 + 2a''b'' \cos\{(\omega_1 - \omega_2)t - 4\delta)\}$$

The frequencies of the PD1 and PD2 signals are the same, and along the shift of the diffraction gratings, the phases will represent a difference of $8\delta$. In other words, the phase difference of these signals has a cycle eight times the cycle of the diffraction gratings GS. Here, the phase adjusted to each diffraction light by one diffraction along the shift of the diffraction gratings GS is expressed by the following equation:

$$\delta = \frac{2\pi x}{d}$$

where the grating constant is d and the shifting amount of the diffraction gratings is x. Therefore, the phase difference detected by the phase difference detector PDD is:

$$\theta = 8\delta = \frac{16\pi x}{d}$$

From this equation, it is possible to calculate the displacement of the gratings. In the present embodiment, the phase difference generated by the predetermined shifting amount of the diffraction grating becomes also two times $8\delta$ as compared with the phase difference $4\delta$ represented in FIG. 1 described earlier.

Figure 12:
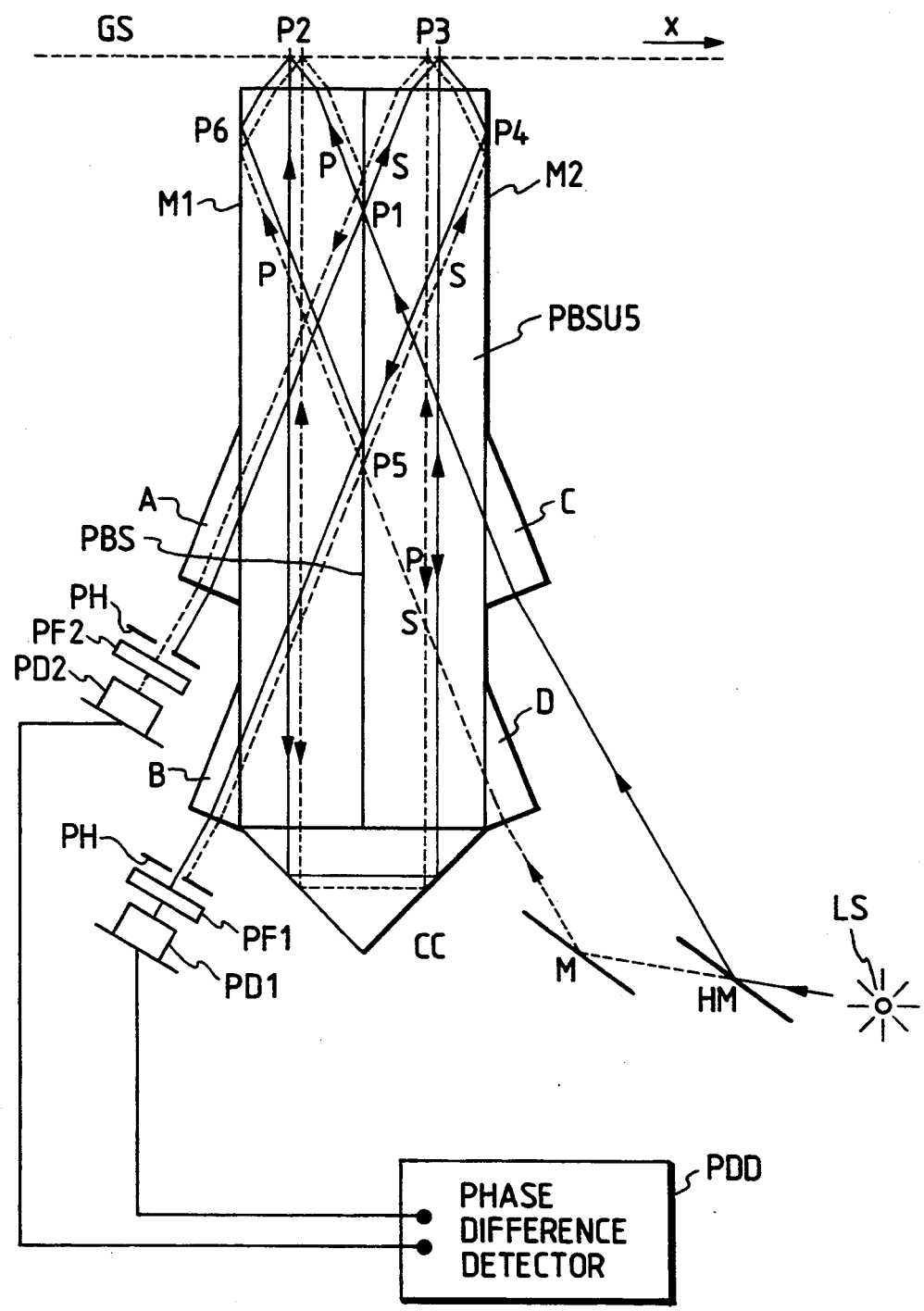
FIG. 12 is a view illustrating a partial variation of the part shown in FIG. 11.

In the present embodiment, it may be possible to make the diffraction gratings GS those of a reflective type and replace the PBS unit with a PBSU 5 in which corner cube CC is closely arranged by providing four light beam inlets and outlets (A, B, C, and D). In other words, it is possible to adopt the mode as shown in FIG. 12. It is substantially equal to FIG. 11 with the exception of the position of the corner cube which is in the reflection side.

Each of the above-described embodiments can be used for a speed measuring apparatus which measures speed as an amount of displacement per unit time. According to the above-described embodiments, a measuring apparatus having a higher degree of resolution than before can be used to detect optical displacement information.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the claims. The following claims are to be accorded a broad interpretation, so as to encompass all possible modifications and equivalent structures and functions.

What is claimed is:

1. A measuring method, comprising the steps of:
   producing a first pair of beams and a second pair of beams, said first pair of beams and second pair of beams each having higher and lower frequency light beams in order to form beat signals, respectively, and said first pair of beams and second pair of beams being produced so that the beat signals formed by each pair of beams have the same frequency;
   diffracting each of said beams with a diffraction grating so that the light beam of the lower frequency in said first pair of beams and the light beam of the higher frequency in said second pair of beams are diffracted with a positive order, and the light beam of the higher frequency in said first pair of beams and the light beam of the lower frequency in said second pair of beams are diffracted with a negative order;
   producing a first beat signal with the first pair of beams diffracted by said diffraction grating;
   producing a second beat signal with the second pair of beams diffracted by said diffraction grating; and
   detecting a phase difference between said first and second beat signals to thereby measure information concerning the relative displacement of the diffraction grating with respect to said first and second pairs of beams.

2. A measuring method according to claim 1, wherein said diffracting step is performed so that the respective beams are diffracted two times with the same order.

3. A measuring method according to claim 1, wherein said diffracting step comprises the steps of diffracting the light beam of the lower frequency in said first pair of beams and the light beam of the higher frequency in said second pair of beams with the same positive order, and diffracting the light beam of the higher frequency in said first pair of beams and the light beam of the lower frequency in said second pair of beams with the same negative order, respectively.

4. A measuring method according to claim 1, wherein said diffracting step comprises the steps of passing the light beam of the lower frequency in said first pair of beams and the light beam of the higher frequency in said second pair of beams along substantially the same optical path, and passing the light beam of the higher frequency in said first pair of beams and the light beam of the lower frequency in said second pair of beams along substantially the same optical path.

5. A measuring method according to claim 1, further comprising a step of propagating said first and second pairs of beams through a polarization maintaining optical fiber.

6. A measuring method according to claim 1, further comprising a step of propagating said first and second pairs of beams in a prism having a polarized beam splitter plane and a plane for reflecting said first and second pairs of beams.

7. A measuring apparatus for measuring information concerning a relative displacement with respect to a diffraction grating, comprising:

beam producing means for producing a first pair of beams and a second pair of beams, said first pair of beams and second pair of beams each having higher and lower frequency light beams in order to form beat signals, respectively, and said first pair of beams and second pair of beams being produced so that the beat signals formed by each pair of beams having the same frequency;

optical means, for guiding said beams to isolate specific diffraction orders so that the light beam of the lower frequency in said first pair of beams and the light beam of the higher frequency in said second pair of beams are diffracted with a positive order, and the light beam of the higher frequency in said first pair of beams and the light beam of the lower frequency in said second pair of beams are diffracted with a negative order;

first detection means for detecting a first beat signal produced by said first pair of beams, said first beat signal being produced by using said first pair of beams diffracted at the diffraction grating with said optical means;

second detection means for detecting a second beat signal produced by said second pair of beams, said second beat signal being produced by using said second pair of beams diffracted at the diffraction grating with said optical means; and measuring means for measuring information concerning a phase change by comparing said first and second beat signals, and the relative displacement information for the diffraction grating being measured by the measurement conducted by said measuring means.

8. A measuring apparatus according to claim 7, wherein said optical means causes each of the beams to be diffracted two times with the same order.

9. A measuring apparatus according to claim 7, wherein said optical means comprises means for diffracting the light beam of the lower frequency in said first pair of beams and the light beam of the higher frequency in said second pair of beams with +first order, and for diffracting the light beam of the higher frequency in said first pair of beams and the light beam of the lower frequency in said second pair of beams with −first order.

10. A measuring apparatus according to claim 7, wherein said optical means comprising means for passing the light beam of the lower frequency in said first pair of beams and the light beam of the higher frequency in said second pair of beams along substantially the same optical path, and for passing the light beam of the higher frequency in said first pair of beams and the light beam of the lower frequency in said second pair of beams along substantially the same path.

11. A measuring apparatus according to claim 7, wherein said optical means has a polarization maintaining optical fiber to cause said beams to be propagated therein.

12. A measuring apparatus according to claim 7, wherein said optical means has a prism having a polarized beam splitter plane and a plane for reflecting said beams to cause said beams to be propagated therein.

13. A measuring apparatus for measuring a relative displacement information concerning two objects, comprising:

a diffraction grating adapted to be mounted on one of the two objects;

a beam producing portion for producing a first pair of beams and a second pair of beams, said first pair of beams and second pair of beams each having higher and lower frequency light beams in order to form beat signals, respectively, and said first pair of beams and second pair of beams being produced so that the beat signals formed by each pair of said beams having the same frequency;

an optical system adapted to be mounted on the other of the two objects and for guiding said beams to isolate specific diffraction orders so that the light beam of the lower frequency in said first pair of beams and the light beam of the higher frequency in said second pair of beams are diffracted with a positive order, and the light beam of the higher frequency in said first pair of beams and the light beam of the lower frequency in said second pair of beams is diffracted with a negative order;

first detection means for detecting a first beat signal produced by said first pair of beams, said first beat signal being produced by using said first pair of beams diffracted at said diffraction grating with said optical system, second detection means for detecting a second beat signal produced by said second pair of beams, said second beat signal being produced by using said second pair of beams diffracted at said diffraction grating with said optical system; and a signal processing portion for measuring information concerning a phase change by comparing said first and second beat signals, and the relative displacement information for said diffraction grating being measured by the signal processing executed by said signal processing portion.

14. A measuring apparatus for measuring a relative displacement information with respect to a diffraction grating, comprising:

beam producing means for producing a first pair of beams and a second pair of beams, said first pair of beams and second pair of beams having higher and lower frequency light beams in order to form beat signals, respectively, and said first pair of beams and second pair of beams being produced so that the beat signals formed by each pair of said beams having the same frequency;

optical means for guiding said beams to isolate specific diffraction orders so that the light beam of the lower frequency in said first pair of beams and the light beam of the higher frequency in said second pair of beams are diffracted with a first order, and the light beam of the higher frequency in said first pair of beams and the light beam of the lower frequency in said second pair of beams are diffracted with a second order different from said first order;

first detection means for detecting a first beat signal produced by said first pair of beams, said first beat signal being produced by using said first pair of beams diffracted by the diffraction grating with said optical means;

second detection means for detecting a second beat signal produced by said second pair of beams, said second beat signal being produced by using said second pair of beams diffracted by the diffraction grating with said optical means; and measuring means for measuring information concerning a phase change by comparing said first and second beat signals, and the relative displacement information for the diffraction grating being measured by the measurement conducted by said measuring means.

* * * * *

UNITED STATES PATENT AND TRADEMARK OFFICE
CERTIFICATE OF CORRECTION

PATENT NO.  : 5,404,220
DATED       : April 4, 1995
INVENTOR(S) : SEIJI TAKEUCHI, et al.

It is certified that error appears in the above-indentified patent and that said Letters Patent is hereby corrected as shown below:

COLUMN 2

Line 29, "interference" should read --interfere--.

COLUMN 3

Line 57, "$(=\delta/2\delta \cdot P,$" should read --$(=(\delta/2\pi) \cdot P,$--.

COLUMN 8

Line 41, "amount 467" should read --amount 4 $\delta$--.

COLUMN 10

Line 1, "a" should be deleted.

COLUMN 19

Line 18, "having" should read --have--.
Line 57, "comprising" should read --comprises--.

UNITED STATES PATENT AND TRADEMARK OFFICE
CERTIFICATE OF CORRECTION

PATENT NO. : 5,404,220

DATED : April 4, 1995

INVENTOR(S) : SEIJI TAKEUCHI, et al.

It is certified that error appears in the above-indentified patent and that said Letters Patent is hereby corrected as shown below:

<u>COLUMN 20</u>

Line 17, "having" should read --have--.
    Line 54, "having" should read --have--.

Signed and Sealed this

Fourth Day of July, 1995

Attest:

BRUCE LEHMAN

*Attesting Officer*      *Commissioner of Patents and Trademarks*